(12) United States Patent
Glaise et al.

(10) Patent No.: US 7,249,309 B2
(45) Date of Patent: Jul. 24, 2007

(54) SINGLE-BURST-CORRECTION / DOUBLE-BURST-DETECTION ERROR CODE

(75) Inventors: Rene Glaise, Nice (FR); Arnaud Vangelisti, Nancy (FR)

(73) Assignee: International Business Machines Corporation, Armonk, NY (US)

( * ) Notice: Subject to any disclaimer, the term of this patent is extended or adjusted under 35 U.S.C. 154(b) by 466 days.

(21) Appl. No.: 10/669,512

(22) Filed: Sep. 23, 2003

(65) Prior Publication Data

US 2004/0103362 A1 May 27, 2004

(30) Foreign Application Priority Data

Nov. 13, 2002 (EP) ................................. 02368123

(51) Int. Cl.
*H03M 13/03* (2006.01)

(52) U.S. Cl. ..................................................... 714/781
(58) Field of Classification Search ......... 714/781–786
See application file for complete search history.

(56) References Cited

U.S. PATENT DOCUMENTS 4,677,623 A * 6/1987 Iwasaki et al. ............. 714/762
5,822,336 A * 10/1998 Weng et al. ................ 714/784
6,836,869 B1 * 12/2004 Wyland ...................... 714/781

* cited by examiner

*Primary Examiner*—Shelly Chase
(74) *Attorney, Agent, or Firm*—Sawyer Law Group LLP

(57) ABSTRACT

A method and apparatus for performing encoding and decoding of bit chain data packets conveying errors which do not spread on more than n bits, at very high speed. In one embodiment, a matrix of the corresponding Systematic code is built using p×p matrix blocks comprising elements of a galois field, generated by an irreducible generator polynomial of degree p, p being greater or equal to n.

14 Claims, 10 Drawing Sheets

Table 200:

| | | | |
|---|---|---|---|
| $\alpha^0$ | 0 | 0 | 1 |
| $\alpha^1$ | 0 | 1 | 0 |
| $\alpha^2$ | 1 | 0 | 0 |
| $\alpha^3$ | 0 | 1 | 1 |
| $\alpha^4$ | 1 | 1 | 0 |
| $\alpha^5$ | 1 | 1 | 1 |
| $\alpha^6$ | 1 | 0 | 1 |

...

Table 210:

| | | | |
|---|---|---|---|
| $\varnothing$ | 0 | 0 | 0 |

Table 220 (with row grouping 230 on left, and grouping 240 on right):

| 230 | # | c1 | c2 | c3 | c4 | c5 | c6 | c7 | c8 | 240 |
|---|---|---|---|---|---|---|---|---|---|---|
| $\alpha^0$ | 0 | 0 | 0 | 0 | 0 | 0 | 0 | 0 | 1 | |
| | 1 | 0 | 0 | 0 | 0 | 0 | 0 | 1 | 0 | |
| | 2 | 0 | 0 | 0 | 0 | 0 | 1 | 0 | 0 | |
| | 3 | 0 | 0 | 0 | 0 | 1 | 0 | 0 | 0 | |
| | 4 | 0 | 0 | 0 | 1 | 0 | 0 | 0 | 0 | |
| | 5 | 0 | 0 | 1 | 0 | 0 | 0 | 0 | 0 | |
| | 6 | 0 | 1 | 0 | 0 | 0 | 0 | 0 | 0 | |
| | 7 | 1 | 0 | 0 | 0 | 0 | 0 | 0 | 0 | |
| | 8 | 0 | 1 | 1 | 0 | 1 | 0 | 1 | 1 | $\alpha^3$ |
| | 9 | 1 | 1 | 0 | 1 | 0 | 1 | 1 | 0 | |
| $\alpha^4$ | 10 | 1 | 1 | 0 | 0 | 0 | 1 | 1 | 1 | |
| | 11 | 1 | 1 | 1 | 0 | 0 | 1 | 0 | 1 | |
| | 12 | 1 | 0 | 1 | 0 | 0 | 0 | 0 | 1 | |
| | 13 | 0 | 0 | 1 | 0 | 1 | 0 | 0 | 1 | $\alpha^0$ |
| | 14 | 0 | 1 | 0 | 1 | 0 | 0 | 1 | 0 | |
| $\alpha^6$ | 15 | 1 | 0 | 1 | 0 | 0 | 1 | 0 | 0 | |
| | 16 | 0 | 0 | 1 | 0 | 0 | 0 | 1 | 1 | |
| | 17 | 0 | 1 | 0 | 0 | 0 | 1 | 1 | 0 | |
| | 18 | 1 | 0 | 0 | 0 | 1 | 1 | 0 | 0 | $\alpha^2$ |
| | 19 | 0 | 1 | 1 | 1 | 0 | 0 | 1 | 1 | |
| $\alpha^5$ | 20 | 1 | 1 | 1 | 0 | 0 | 1 | 1 | 0 | |
| | 21 | 1 | 0 | 1 | 0 | 0 | 1 | 1 | 1 | |
| | 22 | 0 | 0 | 1 | 0 | 0 | 1 | 0 | 1 | |
| | 23 | 0 | 1 | 0 | 0 | 1 | 0 | 1 | 0 | $\alpha^1$ |
| | 24 | 1 | 0 | 0 | 1 | 0 | 1 | 0 | 0 | |
| $\alpha^1$ | 25 | 0 | 1 | 0 | 0 | 0 | 0 | 1 | 1 | |
| | 26 | 1 | 0 | 0 | 0 | 0 | 1 | 1 | 0 | |
| | 27 | 0 | 1 | 1 | 0 | 0 | 1 | 1 | 1 | |
| | 28 | 1 | 1 | 0 | 0 | 1 | 1 | 1 | 0 | $\alpha^4$ |
| | 29 | 1 | 1 | 1 | 1 | 0 | 1 | 1 | 1 | |
| $\alpha^2$ | 30 | 1 | 0 | 0 | 0 | 0 | 1 | 0 | 1 | |
| | 31 | 0 | 1 | 1 | 0 | 0 | 0 | 0 | 1 | |
| | 32 | 1 | 1 | 0 | 0 | 0 | 0 | 1 | 0 | |
| | 33 | 1 | 1 | 1 | 0 | 1 | 1 | 1 | 1 | $\alpha^5$ |
| | 34 | 1 | 0 | 1 | 1 | 0 | 1 | 0 | 1 | |

Figure 2

| 330 | 320 | | 340 | 370 | 360 |
|---|---|---|---|---|---|
| ∅ | 0 0 0<br>0 0 0<br>0 0 0 | 0 0 1<br>0 1 0<br>1 0 0 | $\alpha^0$ | 0 0 1<br>0 1 0<br>1 0 0 | $\alpha^0$ |
| $\alpha^0$ | 0 0 1<br>0 1 0<br>1 0 0 | 0 0 0<br>0 0 0<br>0 0 0 | ∅ | 0 0 1<br>0 1 0<br>1 0 0 | $\alpha^0$ |
| $\alpha^1$ | 0 1 0<br>1 0 0<br>0 1 1 | 0 1 1<br>1 1 0<br>1 1 1 | $\alpha^3$ | 0 0 1<br>0 1 0<br>1 0 0 | $\alpha^0$ |
| $\alpha^5$ | 1 1 1<br>1 0 1<br>0 0 1 | 1 1 0<br>1 1 1<br>1 0 1 | $\alpha^4$ | 0 0 1<br>0 1 0<br>1 0 0 | $\alpha^0$ |
| $\alpha^3$ | 0 1 1<br>1 1 0<br>1 1 1 | 0 1 0<br>1 0 0<br>0 1 1 | $\alpha^1$ | 0 0 1<br>0 1 0<br>1 0 0 | $\alpha^0$ |
| $\alpha^2$ | 1 0 0<br>0 1 1<br>1 1 0 | 1 0 1<br>0 0 1<br>0 1 0 | $\alpha^6$ | 0 0 1<br>0 1 0<br>1 0 0 | $\alpha^0$ |
| $\alpha^4$ | 1 1 0<br>1 1 1<br>1 0 1 | 1 1 1<br>1 0 1<br>0 0 1 | $\alpha^5$ | 0 0 1<br>0 1 0<br>1 0 0 | $\alpha^0$ |

| | 521 | 522 | 540 | 523 | 550 | 560 |
|---|---|---|---|---|---|---|
| ∅ | 0 0 0 / 0 0 0 / 0 0 0 | 0 0 0 / 0 0 0 / 0 0 0 | ∅ | 0 0 1 / 0 1 0 / 1 0 0 | | $\alpha^0$ |
| ∅ | 0 0 0 / 0 0 0 / 0 0 0 | 0 0 1 / 0 1 0 / 1 0 0 | $\alpha^0$ | 0 0 0 / 0 0 0 / 0 0 0 | | ∅ |
| $\alpha^0$ | 0 0 1 / 0 1 0 / 1 0 0 | 0 0 0 / 0 0 0 / 0 0 0 | ∅ | 0 0 0 / 0 0 0 / 0 0 0 | | ∅ |
| $\alpha^0$ | 0 0 1 / 0 1 0 / 1 0 0 | 0 0 1 / 0 1 0 / 1 0 0 | $\alpha^0$ | 0 0 1 / 0 1 0 / 1 0 0 | × $\alpha^0$ = | $\alpha^0$ |
| $\alpha^0$ | 0 0 1 / 0 1 0 / 1 0 0 | 0 1 0 / 1 0 0 / 0 1 1 | $\alpha^1$ | 1 0 1 / 0 0 1 / 0 1 0 | × $\alpha^6$ = | $\alpha^0$ |
| $\alpha^0$ | 0 0 1 / 0 1 0 / 1 0 0 | 1 0 0 / 0 1 1 / 1 1 0 | $\alpha^2$ | 1 1 1 / 1 0 1 / 0 0 1 | × $\alpha^5$ = | $\alpha^0$ |
| $\alpha^0$ | 0 0 1 / 0 1 0 / 1 0 0 | 0 1 1 / 1 1 0 / 1 1 1 | $\alpha^3$ | 1 1 0 / 1 1 1 / 1 0 1 | × $\alpha^4$ = | $\alpha^0$ |
| $\alpha^0$ | 0 0 1 / 0 1 0 / 1 0 0 | 1 1 0 / 1 1 1 / 1 0 1 | $\alpha^4$ | 0 1 1 / 1 1 0 / 1 1 1 | × $\alpha^3$ = | $\alpha^0$ |
| $\alpha^0$ | 0 0 1 / 0 1 0 / 1 0 0 | 1 1 1 / 1 0 1 / 0 0 1 | $\alpha^5$ | 1 0 0 / 0 1 1 / 1 1 0 | × $\alpha^2$ = | $\alpha^0$ |
| $\alpha^0$ | 0 0 1 / 0 1 0 / 1 0 0 | 1 0 1 / 0 0 1 / 0 1 0 | $\alpha^6$ | 0 1 0 / 1 0 0 / 0 1 1 | × $\alpha^1$ = | $\alpha^0$ |

| Nb of errors | Miscorrected | Corrected | Detected | Total |
|---|---|---|---|---|
| 1 | 0 | 16 | 0 | 16 |
| 2 | 0 | 26 | 94 | 120 |
| 3 | 9 | 22 | 529 | 560 |
| 4 | 15 | 10 | 1795 | 1820 |
| 5 | 13 | 2 | 4353 | 4368 |
| 6 | 53 | 0 | 7955 | 8008 |
| 7 | 58 | 0 | 11382 | 11440 |
| 8 | 59 | 0 | 12811 | 12870 |
| 9 | 55 | 0 | 11385 | 11440 |
| 10 | 41 | 0 | 7967 | 8008 |
| 11 | 17 | 0 | 4351 | 4368 |
| 12 | 7 | 0 | 1813 | 1820 |
| 13 | 0 | 0 | 560 | 560 |
| 14 | 0 | 0 | 120 | 120 |
| 15 | 0 | 0 | 16 | 16 |
| 16 | 0 | 0 | 1 | 1 |
| Total: | 327 | 76 | 65132 | 65535 |

Figure 10

SINGLE-BURST-CORRECTION / DOUBLE-BURST-DETECTION ERROR CODE

FIELD OF THE INVENTION

The present invention relates to ECC (error correcting code) in general and is more specifically concerned with a code adapted to correct errors occurring on high-speed serial links encoded in such a way that the errors do not spread on more than a limited number of bits.

BACKGROUND OF THE INVENTION

Communications equipment e.g., routers and switches, are now required to move data packets in a Tbps (Tera or $10^{12}$ bits per second) range and soon beyond. To achieve such a level of performance those communications devices uses many multi-Gbps (Giga or $10^9$ bits per second) high speed serial links. The standard being now a 2.5 Gbps link. Thousands of such links are thus required to convey data packets IN and OUT of a Tbps-class switch fabric. Because of the speeds involved serial links are using, in most applications, a code, such as a 8B/10B DC balanced code, to improve the transmission characteristics yet at the expense of a 20% overhead which reduces the effective data rate to 2.0 Gbps. Because the technology (generally CMOS) is used at its upper limit of operation and due to the huge amount of moved data, the probability of an error occurrence is becoming too high. Even though a link can be specified with a $10^{15}$ BER (bit error rate), an already exceptionally good value, an error would however potentially occurs every 8 nm or so. Indeed, in a Tbps switch, moving $10^{12}$ bits IN and OUT at every second, the $10^{15}$ level thus, a probability of 1 to get an error, is reached every 500 seconds i.e., 8 minutes. This is clearly unacceptable.

Moreover, technology itself, i.e., the ASICs (application specific integrated circuits) used to implement the switching functions, are subject to 'soft' errors as a result of the extreme miniaturization of their memory elements. Hence, new designed equipment tend to incorporate ECC (error correcting codes) in order to correct, on-the-fly, occasional errors to obtain a MTBF (mean time between failure) compatible with the domain of applications considered by the invention i.e., data communications networks for multipurpose services (data and voice) where the level of expectation is very high since this type of equipment is assumed to work, error-free, 24 hours a day and 7 days a week.

The 8B/10B code as described in U.S. Pat. No. 4,486,739 from IBM untitled 'Byte oriented DC balanced (0,4) 8B/10B partitioned block transmission code', 1984, by Franaszek and Widmer is well adapted to the transmission of digital signals over high-speed i.e., multi-Gbps, serial links used in numerous instances of communications equipment which are now required to cope with aggregate data throughput expressed in Tera or $10^{12}$ bps. This code has been specified as a standard by ANSI i.e., the American National Standards Institute. While 8B/10B was first used by the ANSI Fiber-Channel FC-1 layer transmission protocol, including serial encoding and decoding to and from the physical layer, special characters, and error control; it has since been more largely adopted e.g., for the Gigabit version of Ethernet. Encoding data transmitted at high speeds provides some advantages. 8B/10B code is DC balance thus, encoding limits the effective transmission characteristics, such as the ratio of 1 s to 0 s, on the error rate. Bit-level clock recovery of the receiver can be greatly improved by using data encoding. Also, encoding can help distinguish data bits from control bits. However, this is because 8B/10B encoding increases the possibility that the receiving station can detect and correct transmission or reception errors that it is considered by the invention. Indeed, the code is designed so that the transmission digit errors on the serial links are always confined to the 6B or 4B sub-blocks in which they occur and generate decoded error bursts no longer than 5 or 3, respectively, from a single line digit error. Sub-blocks result from the fact that 8B/10B code is, as above patent title suggests, a partitioned code. This means that each byte is actually composed of two separate 5B/6B and 3B/4B codes. This significantly contributes to reduce error spreading after decoding.

Much more on 8B/10B code can be found in the here above cited US patent and in other publications on this subject. Among them, one may want to refer to an IBM research report published by the IBM Thomas J. Watson Research Center, Yorktown Heights, N.Y. 10598, the USA, 'The ANSI Fibre Channel transmission Code' by Albert X. Widmer, under reference RC-18855, dated April 1993. Thus, 8B/10B code was devised with the objective, among other things, to ease error correction in preventing single line digit error from spreading in more than 5-bit bursts after decoding.

As mentioned in the above referred patent i.e., U.S. Pat. No. 4,486,739, the Fire codes, which are cyclic codes, can be used with very good correcting results on the 8B/10B encoded packets. Fire codes are burst-error-correcting codes thus, are well adapted to cope with the kind of errors occurring on the electrical links as described above i.e., in bursts spanning several contiguous bits after decoding. They can also take care of the soft errors of the ASIC devices used to implement the switching function since soft errors generally affect a single bit i.e., a binary latch or a single bit of a RAM (random access memory). A description of Fire codes can easily be found in the abundant literature on ECC. Among many examples, one can refer to 'Error Control Coding', a book by Shu LIN and Daniel J. Costello, Prentice-Hall, 1983, ISBN 0-13-283796-X and more specifically to chapter 9 on 'Burst-Error-Correcting Codes'. The use of such Fire codes has however drastic practical limitations. If they are actually able of correcting a single burst of errors their detect ability of errors spreading on more bits is however poor.

Similarly, Burton codes, which are specific Fire codes, have a better level of correct ability than Fire codes however, at the expense of an even lower level of detection when errors spread on more bits than what they can normally correct.

SUMMARY OF THE INVENTION

It is an object of the invention to provide a method and apparatus for encoding and decoding packets with an ECC code having overall better decoding performance than the codes of the prior art when the errors do not spread on more than a limited number of bits in the packet.

It is a further object of the invention to provide a decoding method which, when implemented in an ASIC, can be used in communications equipment sustaining move of packets at speeds in a Tbps range.

These objects are achieved with an encoding method according to claims 1 to 4 based on a Systematic Linear Block code.

These objects are also achieved with a decoding method, based on a Systematic Linear Block code and comprising steps for error detection and error correction.

These objects are also achieved with a decoding method, based on a Systematic Linear Block code and comprising steps for error correction only.

These objects are also achieved with an apparatus for and an apparatus for decoding based on a Systematic Linear Block code.

When the method and apparatus of the preferred embodiment of the invention are used in a communications equipment, the soft errors inside the communications equipment and the errors limited inside fixed size bursts are 100% corrected if confined to one burst and are all detected if spread on two bursts. These results are obtained because the error detection steps of the decoding method separates errors between correctable and the uncorrectable errors. This criterion is used during the execution of the following steps of correction of errors in order to avoid correcting errors which are not correctable which creates new errors in the decoded packets as it happens with the Fire codes of today.

In another embodiment of the invention the errors are no more detected with the use of the correctable/non correctable error criterion but are all directly corrected with a level of correct ability higher than with the Fire codes of the prior art and for a same code length. Consequently, the corresponding method and apparatus correct errors in packets having a greater length than with the Fire codes but with the same overhead.

A switch fabric implementing the encoding and decoding methods of the invention having 2.5 Gbps input and output links can sustain a move of data packets at speeds in a Tbps range. As a matter of fact, the ASIC implementation of the decoding method of the invention is a combinatorial logic. Consequently, the decoding operation is performed in a single or a few processing steps allowing to sustain speeds in the Tbps range even when the ASIC implementation uses CMOS, a cost-performance technology.

When the errors in the packets do not spread on more than 5 bits, as with data packets transported on 8B/10B coded links, the code generated by the method and apparatus according to the preferred embodiment of the invention and applied to typical 512-bit packets and up to 1040-bit, is 21-bit long.

BRIEF DESCRIPTION OF THE DRAWINGS

FIG. 2 Shows a matrix for a Fire code of the prior art and elements of the Galois Field generated by the generator polynomial of the code;

FIG. 3 Shows the matrix for a (35, 27) Burton code;

FIG. 5 shows the matrix for a linear systematic ECC code according to the preferred embodiment of the invention;

FIG. 10 shows tables containing performance data obtained while using the linear systematic ECC code according to the preferred embodiment of the invention.

DESCRIPTION OF THE PREFERRED EMBODIMENT

Figure 1:
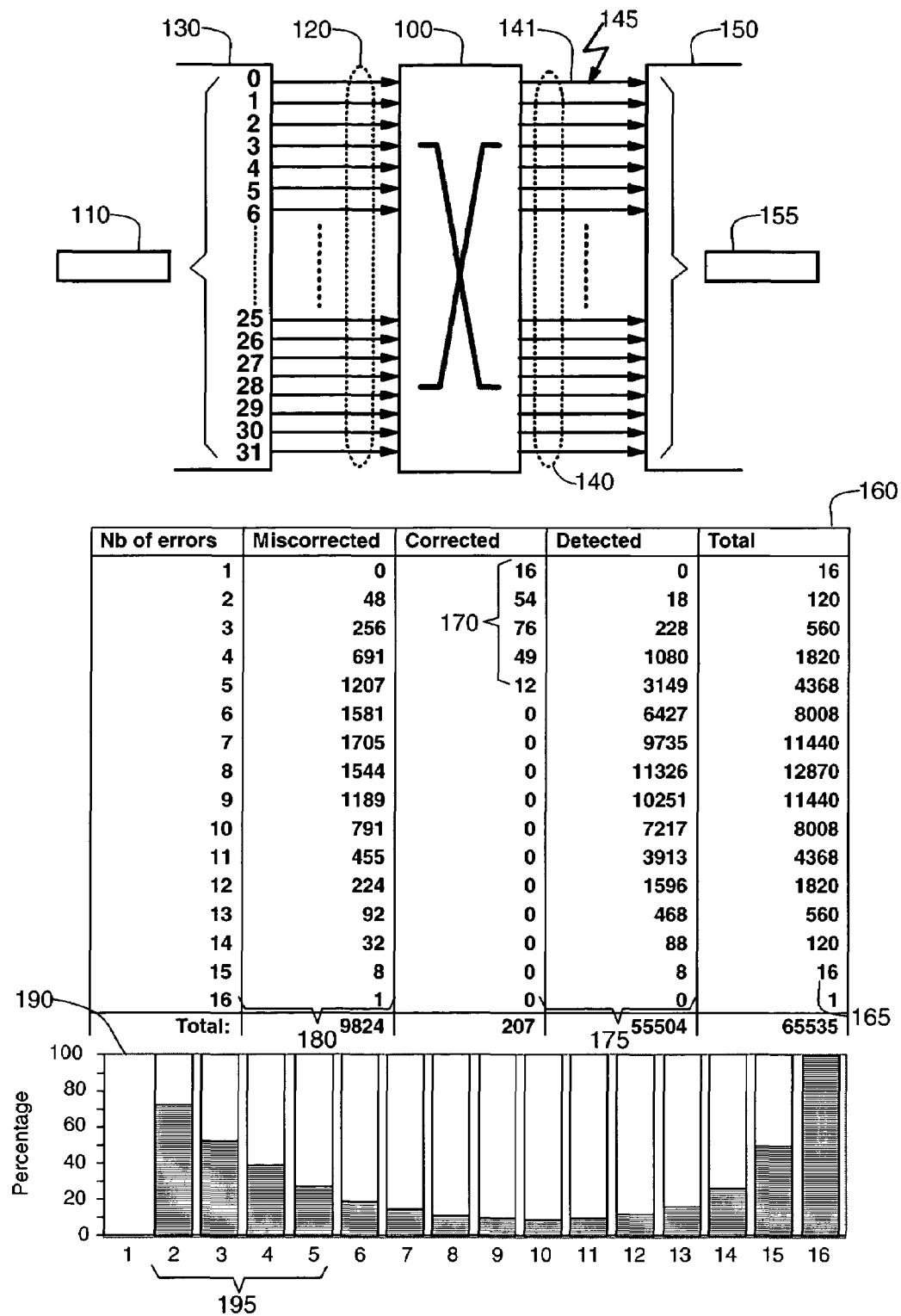
FIG. 1 comprises an illustration of the environment of the encoding and decoding methods and apparatus of the invention, and tables containing performance data obtained while using the Fire codes of the prior art in the same environment.

FIG. 1 illustrates (110–155) one example of environment where the encoding and decoding methods of the invention can be used, namely in high speed communication equipment wherein the data packets are 8B/10B encoded when moved between ASICs.

In the preferred embodiment, in a communications switch and router equipment of a Tbps class (100), each packet (110) must be transported in general on multiple high-speed (i.e., multi-Gbps) links in order to be able to reach the specified level of performance. As an example, if switch ports must comply with OC-768c (40 Gbps) line speed as many as 32 links IN (120) and OUT (140) may have to be used per port adapter (130, 150). OC-768c and other such rates are part of a family of standard rates and formats available for use in optical interfaces, generally referred to as SONET, which is also, like here above 8B/10B code, a standard defined by ANSI. Each individual link e.g., (141) is thus, in this example, a 8B/10B coded 2.5 Gbps serial link. Because of the 8B/10B coding overhead (20%) the effective data rate of links is reduced to 2 Gbps. Then, 32 links achieve a total of 64 Gbps which is compatible with an OC-768c line speed at 40 Gbps being given the speedup factor, over the nominal line speed, necessary to operate efficiently such port interfaces in communications equipment.

Each packet (110) is 8B/10B encoded in the ingress adapter (130) before entering on the IN links (120) the rest of the communications equipment (100), goes out on the OUT links (141) and is decoded in the egress adapter (150) before being transmitted (155). If a single error occurs on a link e.g., (145) this translates, after decoding, because of the properties of the 8B/10B coding already discussed, by a single 5-bit or 3-bit error burst in the transmitted packet (155).

If an ECC code is used to cross the communications equipment (100), ECC encoding is first performed on the entering packet (110) in the ingress adapter (130). The ECC encoded packet is then 8B/10B encoded in the ingress adapter before moving to the rest of the communications equipment. At the exit on the OUT links (141), the packet is 8B/10B decoded in the egress adapter (150) where it is decoded by the ECC. Thus, the single 5-bit or 3-bit error burst in the transmitted packet (155) is normally corrected by the ECC code. Hence, combining 8B/10B coding and an ECC is a very effective solution to increase the MTBF of modern data packet communications equipment to a level of quality compatible with what carrier-class network operators (i.e., telephone companies) are used to install to ensure a non-disruptive service to their customers.

However, in the environment described, more than a single error can occur on a link or, multiple errors are probable because two links could experience an error that would reflect in a same received packet (155) or, because two errors result from the combination of two different error mechanisms like a transmission error on a link and, simultaneously (i.e., in a same packet), the occurrence of a soft error of the kind discussed in the background section. This type of error cannot be handled satisfactorily at high speed by the level of detect ability of known ECC codes even if, according to the cited prior art, a Fire code can be used as an ECC in the communications equipment.

The lack of performance of the Fire codes is illustrated by the tables (160) and (190) which contain performance data computed with the use of a Fire code that would supposedly fit the type of environment discussed above. The Fire code of FIG. 2, like all other cyclic codes, is completely specified by its generator polynomial G(X) as follows:

$$G(X)=(X^{10}+1)(X^6+X^1+1)$$

The right polynomial is a primitive, irreducible, polynomial of degree 6. A list of such polynomials can be found in 'Error Correcting Codes', Peterson & Weldon, 2nd edition, the MIT press, 1972, ISBN:0 262 16 039 0. This irreducible polynomial (i.e.: $X^6+X^1+1$) referred to as G103, because '103' is the octal notation of this polynomial as listed in the above reference, is also primitive. Hence, G103 allows to generate a Galois Field (GF) of maximum length, i.e.: $2^6-1=63$. The length of the Fire code obtained from it after multiplication by the left factor ($X^{10}+1$) is 10×63=630. From the above literature and theory on Fire codes in general, it can easily be shown that this degree-16 code, requiring a convenient 2-byte (16-bit) extra field for encoding, is indeed capable of correcting any burst up to 5-bit and, because it is 630-bit long, it fits applications of the kind considered by the invention where 64-byte (512-bit) packets must be protected.

In FIG. 1, a first table (160) lists all the errors that may possibly result from errors occurring on a single link thus, carrying 2-byte (16-bit) of a standard 64-byte or 512-bit packet of the kind handled by such communications equipment. There are $2^{16}-1=65535$ (165) such error cases on 16 bits.

This kind of table, which corresponds to here above generator polynomial G(X), for all errors possibly occurring on the first link, can readily be computed by those skilled in the art of ECC on the sole knowledge of the particular generator G(X) in use. Its only purpose is to illustrate, through a particular example, the limitations of Fire codes in terms of detect ability of errors beyond what they can correct. Such limitations are known in general from those skilled in the art and could be illustrated in many different ways as well.

Correctable errors correspond to the table third column. All cases of 1 to up to 5 consecutive bits in error are correctable (170). This is what code is normally able to do and used for. Yet, code is also capable of detecting a good deal of errors that are beyond its correcting capability. This is the 4th column (175). All corresponding detected errors should normally result in the discarding of the corresponding packet plus, possibly, other actions like updating an error log mechanism. These are standard practices in communications equipment. No adverse effect may normally result from the discarding of a packet provided the level of occurrence stays within what has been accounted for (upper level protocols are normally aimed at re-sending missing pieces of data when necessary).

What may pose a problem is the second column (180). Table shows there are a great deal of miscorrected errors that are possible as a result of errors occurring beyond what Fire code is theoretically capable of handling. Since decoding logic misinterpret packet encoding (because errors occurring do not fit the expected model of errors) 'corrections' are going to be applied to the corresponding packets that will, generally, not only correct any of the initial errors but introduce even more errors to what has been received. Such packets are then considered as good, after 'correction' in the receiving port adapter (150), and forwarded even though their contents has been altered. Hence, anything can possibly result from the handling of such miscorrected packets by downwards equipment.

The chart (190) of FIG. 1 shows, from table (160) values, the proportion of miscorrected errors i.e., the percentage of miscorrected errors (180) over the total of miscorrected errors and detected ones (175) as a function of the number of bit in errors in a packet. It is worth noting that when few errors are present (195) in received packets, i.e.: 2, 3, 4 etc. that are beyond code correction capability thus, spread on more than 5 bits, a large percentage of them gives miscorrections. This emphasizes the weakness of Fire codes, as far as detection of errors is concerned, when errors are spreading on more bits than their burst correction capability. This clearly limits their use to applications where errors can always be guaranteed to be confined to single bursts of errors.

FIG. 2 shows a code matrix. For the purpose of a simple representation the matrix is drawn vertically in such a way that when a bit chain vector is multiplied by the matrix, the LSB bits are applied to the top and the MSB bits to the bottom of the matrix columns. This simple representation is used also for all the other matrix shown in the other figures of the rest of the present document. It is noted also that, as well known by the person skilled in the art, a same code matrix is used for bit chain encoding and decoding. For encoding the LSB bit corresponding to the code are set to zero.

The matrix of FIG. 2 is the matrix (220) of a Fire code built using the properties of the Galois field which the elements are listed in a table also shown (200) in this figure. The Fire code which the encoding matrix is shown in FIG. 2 has also a very simple decoding procedure so as it can effectively be implemented in the kind of communications equipment considered by the invention i.e., terabit-class routers and switches e.g., equipped with OC-768 (40 Gbps) ports where each IN and OUT packet must be processed in less than 10 nano ($10^{-9}$) seconds on the average.

Hence, as an elementary example used throughout FIG. 2 and following figures all the vectors (200) of a GF (Galois Field) built from primitive irreducible polynomial:

$$G13=X^3+X^1+1$$

are shown (200). This degree-3 GF is thus comprised of only seven vectors that are noted $\alpha^0$ to $\alpha^6$. These seven binary vectors form a finite field. They can thus be multiplied and added in an algebra modulo 2, modulo G13. The field identity element for multiplication is $\alpha^0$ while the null element of the addition is the all-zero vector (210) here noted Ø.

Then, from G13, a Fire code can be built. A generator polynomial for such a code is for example:

$$G(X)=(X^5+1)(X^3+X^1+1)$$

This particular generator polynomial allows building a (35,27) code capable of correcting errors occurring in bursts of 3-bit or less over 27 data bits plus 8 ECC bits. The 35 vectors that can be generated with above G(X), forming a multiplicative group, are all shown (220).

The structure of the matrix of vectors thus obtained is typical of Fire codes. Any generator polynomial of a Fire code allows building such a matrix. Obviously, for practical applications, G(X) is generally of a higher degree allowing building a longer code like the one of FIG. 1 which is a (630,614) code so as to fit with data packet size. Without any lack of generality the particular example of FIG. 2 is thus chosen so that all vectors can indeed be drawn in a one page figure for a better understanding.

The matrix (220) is thus composed of two series (230, 240) of five consecutive vectors of the GF (200) each starting with a different element of the GF. The fact there are 5 consecutive 3-bit GF vectors in each group results from the multiplication by factor $(X^5+1)$ of an irreducible polynomial i.e.: $(X^3+X^1+1)$ in this example, so as to obtain a generator polynomial G(X) of a Fire code. Combined with the middle vectors (250) it can be easily shown that this structure indeed allows generating a unique syndrome for any combination of 3 consecutive or fewer bits in error that could be present in a 35-bit word comprised of 27 data bits and 8 ECC bits so that the corresponding errors can be corrected. There are possibly, in this example, 35 single-bit errors plus 34 two-bit errors plus 66 three-bit errors thus adding to a total 105 error combinations of 3-bit or less, returning a unique syndrome, that can be detected therefore, corrected.

FIG. 3 shows the matrix of a Burton code. Burton codes are a variant of Fire codes. Like Fire codes, Burton code generator polynomials are the product of two factors. A Burton code, using the same irreducible polynomial G13 as with Fire code of FIG. 2, is:

$$G(X)=(X^3+1)(X^3+X^1+1)$$

Hence, Burton code is a particular kind of Fire code in which the degree of the multiplicative factor must be equal to the degree of the irreducible right polynomial.

This particular generator polynomial allows to build a (21,15) code capable of correcting errors occurring in bursts of 3-bit or less over 15 data bits plus 6 ECC bits. The 21 vectors that can be generated with above G(X), forming a multiplicative group, are all shown (320).

The matrix (320) is thus composed of two series (330, 340) of three consecutive vectors of the GF shown in FIG. 2 each starting with a different element of the GF. Like previously, the fact there are 3 consecutive 3-bit GF vectors in each group results from the multiplication by factor $(X^3+1)$. However, because irreducible polynomial $(X^3+X^1+1)$ is of same degree, there is no middle vector and left (321) and right (322) groups do no overlap. This matrix structure allows to generate a unique syndrome for any combination of 3 or fewer bits in error however, confined to a same group. On the contrary of Fire codes syndromes are no longer unique when bursts span on two groups. Hence, there are possibly, in this example, 7×3 single-bit errors plus 7×3 two-bit errors plus 7 three-bit errors thus adding to a total 49 error combinations of 3-bit or less, returning a unique syndrome when confined in a group, that can be detected therefore, corrected.

Thus, if burst of errors can indeed be confined into groups that do not overlap, Burton codes are more efficient than Fire codes since a (60,52) Burton code of degree 8, like the example of FIG. 2, can be built which is significantly longer than the (35,27) code of this figure example.

This is definitively the case considered by the invention since, as explained earlier, errors occurring on high-speed links are confined to 5-bit or 3-bit sub-blocks of which the 8B/10B code is composed.

Obviously, detect ability of Burton codes, beyond their correction capability, is not better than Fire codes since they are more efficient in term of correction. As an example of this the (21,15) Burton code of FIG. 3 is of degree 6. Thus, there are possibly 63 syndromes of errors of which 49 can be used to perform correction, as explained here above. Hence, detect ability beyond correction capability, is limited to the left syndromes i.e., 14 out of 63.

In order to understand how the encoding matrix of the preferred embodiment described in reference to FIG. 5 is built, one must first notice that using the matrix of FIG. 3, left (321) and right (322) groups in the same figure, if added modulo 2, always return the series of identity matrix (360) shown on the right (370).

Figure 4:
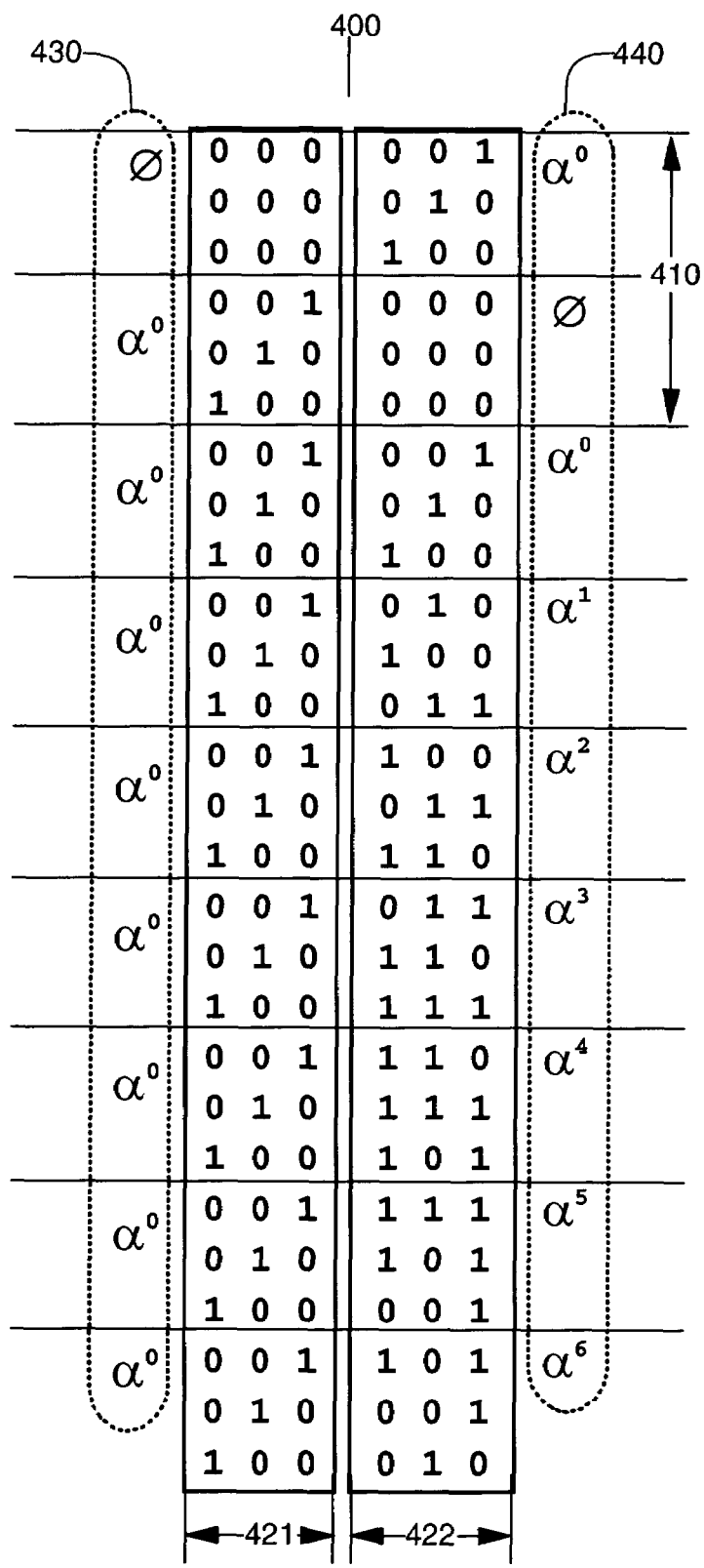
FIG. 4 shows the matrix for a linear systematic ECC code corresponding to a second embodiment of the invention.

FIG. 4 shows a matrix corresponding to a new Systematic code. The matrix of FIG. 4 defines a (27,21) code since all GF vectors of FIG. 2 (200) are now used below the diagonal matrix (410). It is even much more easily decodable than the corresponding Burton code of FIG. 3 since left part of the matrix (421) using only a set identity matrix (430) and the null matrix Ø, now returns directly the error pattern (assumed to be confined to a group). While the right part is indicative of the position to which error has occurred i.e., in which group (440) error is confined.

As this will be further discussed, errors occurring in the first two groups, forming the diagonal matrix (410); so as code is said to be in a systematic form, allowing a straightforward encoding of ECC bits however, deserve a special decoding since structure is different than in the matrix core below. Errors occurring in ECC bits themselves are anyway straightforward to decode because of the presence of the null matrix Ø.

Detect ability of constructed code shown in FIG. 4, beyond what it can correct, is however strictly 0 because this code manages to use all syndromes to correct bursts of errors. Indeed, in this example there are possibly 9×3 single-bit errors ('100', '010' and '001') plus 9×3 two-bit errors ('110', '011' and '101') plus 9×1 three-bit errors ('111') confined to 3-bit groups, thus adding to a total 63 error combinations of 3-bit or less, returning a unique syndrome, that can be detected therefore, corrected.

Hence, constructed code of FIG. 4 is, in term of correct ability, the most efficient that can be constructed. It is definitively much efficient than Burton and Fire codes while retaining their ease of decode through an even simpler structure as it is further discussed.

FIG. 5 shows the matrix of the systematic code of the preferred embodiment. The code corresponding to the matrix of FIG. 5 is not a cyclic code but, anyhow, a systematic code. As explained hereunder, the detect ability of errors obtained with this code are added above the correcting capability of the 'intermediate solution code' described in reference to FIG. 4.

A third column of vectors (523), from GF of FIG. 2 (200), is added so that the product of group first vectors of the second column (540) by those of the third one, below the diagonal matrix (550), returns always the identity vector $\alpha^0$ (560).

As organized in FIG. 5, code becomes a single-burst error correction and double-burst error detection code when error bursts are confined to any of the ten 3-bit groups shown. It is then a (30,21) code requiring 9 ECC bits. In a manner analog to what is computed above one may easily find that there are possibly 70 error combinations to be used for single-burst corrections out of $2^9-1=511$ possible syndromes.

Figure 6:
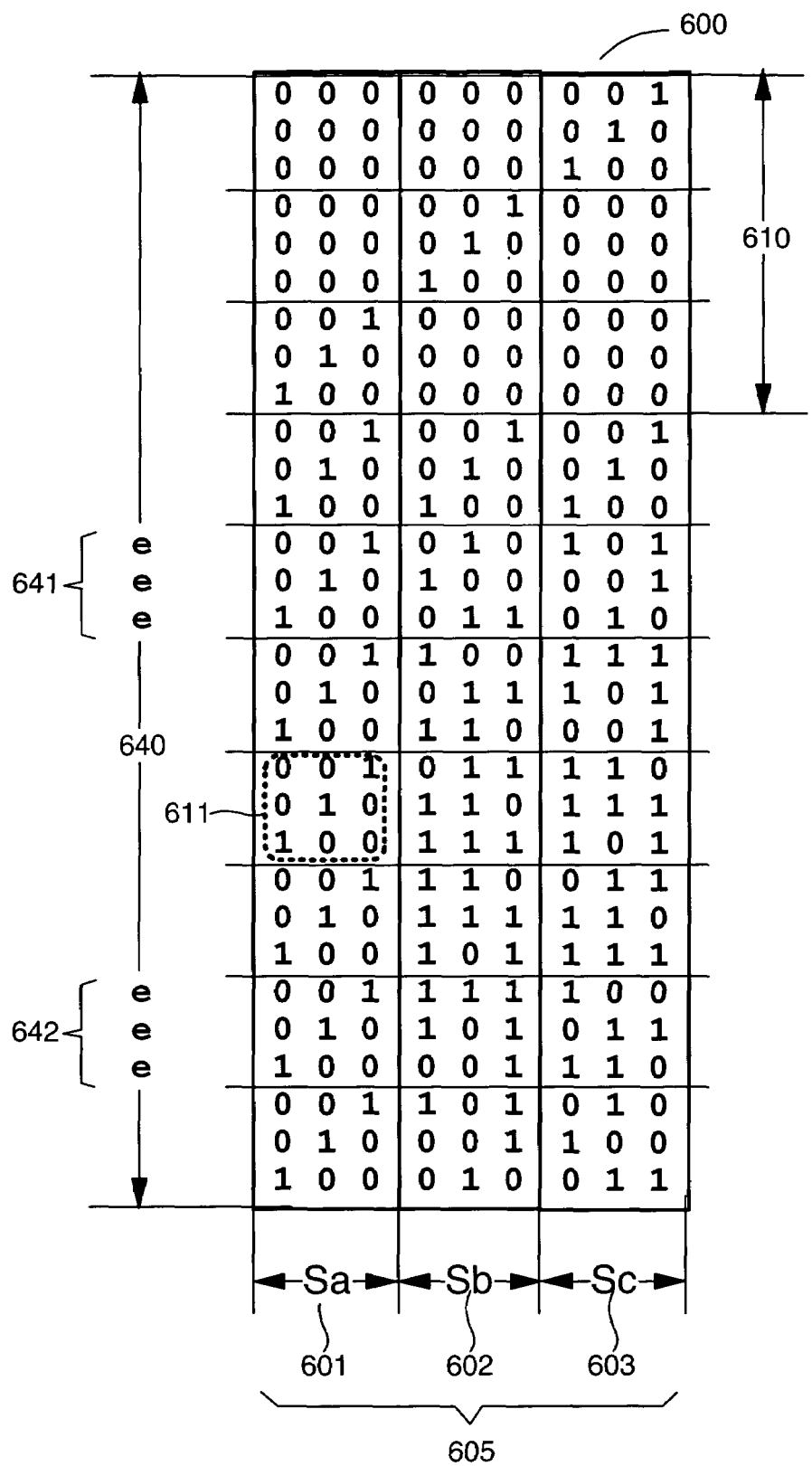
FIG. 6 shows the matrix for a linear systematic ECC code according to the preferred embodiment of the invention and illustrates the correction of errors.

FIG. 6 shows on the matrix of the code of the preferred embodiment already shown in FIG. 5, how the corresponding code is very simply decoded.

When a 30-bit binary word (640) is applied to matrix (600) a syndrome is generated (605). If word was properly encoded and if there is no error in it, result of checking is the all-zero syndrome. The three sub-syndromes of which it is composed namely, Sa (601), Sb (602) and Sc (603), respectively corresponding to the three columns of vectors associated to form the code, thus each returns the GF null vector i.e.: Ø.

However, if an error is present in one of the group e.g., (641) possibly affecting any combination of 1 to 3 bits of this group (there are 7 such combinations), syndrome is unique and different from zero.

If, as shown, error is below the ECC bits i.e., below diagonal matrix (610), this the general case, the first (left) column returns the error pattern since this column is only composed of the first three vectors of the GF i.e., $\alpha^0$, $\alpha^1$ and $\alpha^2$ hence, forming the 3-bit square identity matrix e.g., (611) here after noted I. In this case, in any of the groups below diagonal matrix (610), following holds (in a modulo 2, modulo G13 algebra):

$$Sa^2 = Sa'Sb$$

This results from the fact that, as explained in FIG. 5, in any group, the square matrices belonging to the second and third columns have been composed of successive GF vectors structured so that all first vector products return $\alpha^0$ (560) i.e., the identity vector of the multiplication.

However, when error (641) is within one of the three groups of the diagonal matrix (610), one and only one of the sub-syndromes Sa (601), Sb (602) or Sc (603) is exclusively affected by the error. This is easily decode-able as a single burst error type too. In this case the above expression is not however true when error affects Sa only i.e., when error is in third group otherwise, both terms are null and equality still holds.

If two bursts of errors are present in the word (640). For example (641) and (642) then, none of the above is true thus providing a simple criterion to differentiate between a correctable single-burst error and a other errors especially, double-burst errors. Next figure described how this can be carried out in practice.

Figure 7:
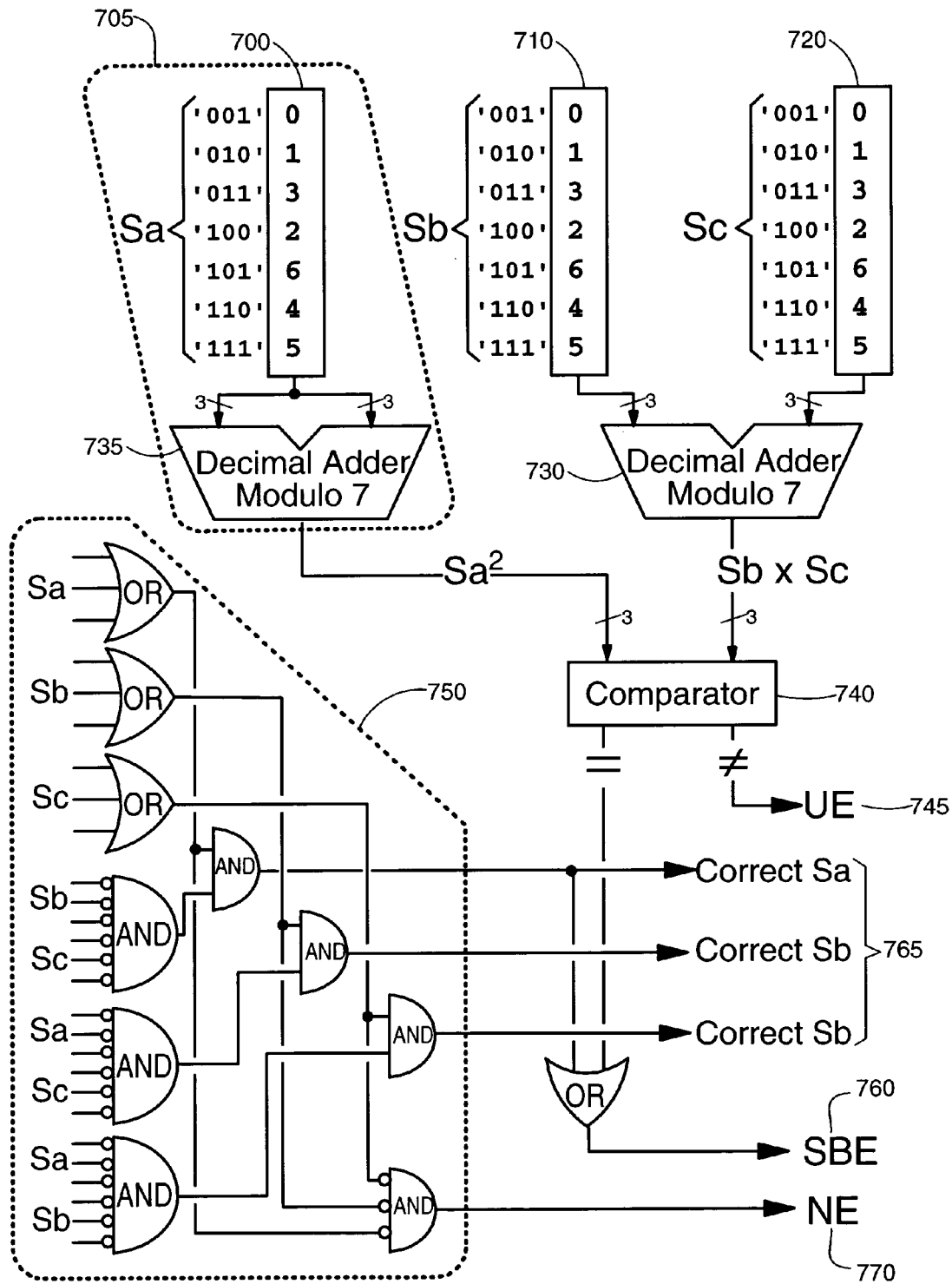
FIG. 7 shows the combinatorial logic implementing the detection steps of the decoding method according to the preferred embodiment of the invention.

FIG. 7 shows a preferred implementation of the logic circuitry that can be used to perform error detection in the decoding component located in the egress adapter (150) of a communications equipment. The encoding component is not illustrated as being a simple matrix computation with the systematic codes which is well known in the art.

The logic described carries out the differentiation between correctable (760) and uncorrectable errors (745) with a code structured as shown in FIG. 5. Those skilled in the art especially, logic designers, will recognize that the invention could be practiced as well in many alternate equivalent ways.

In order to perform multiplication of the sub-syndromes modulo 2, modulo G13, a preferred solution, according to the invention, is to use three lookup tables (700, 710 and 720). In this particular implementation of the invention their contents are identical. They are permanently addressed by the sub-syndromes and return the rank of the corresponding vector in the GF generated by G13 and shown in FIG. 2 (200). Hence, for example, when input of a lookup table is binary vector '110' it returns the decimal value 4 since corresponding vector is $a^4$. Then, to perform the Sa'Sb multiplication discussed in previous figure powers of vectors are added modulo the length of the GF i.e., 7 in this example (730). This, because following holds in a GF:

$$\alpha^X \times \alpha^Y = \alpha^{X+Y (modulo\ field\ length)}$$

To obtain the square of Sa, a multiplication by itself can be performed (735) in a manner similar to what is done above.

An alternate method to compute $Sa^2$ consist in using a different lookup table containing directly the square of each vector of the Galois Field though. Thus, logic (705) would be replaced by a lookup table however, different of (710) and (720). Those skilled in the art can easily compute the contents of such a table.

Also, the two lookup tables (710) and (720) and the adder (730) could be replaced by a single lookup table having however, many more entries i.e., 7×7=49 in this example so as to pre-compute all product values.

These are alternate solutions that would achieve the same result. Choosing one solution depends on implementation considerations like the kind of logic used to carry out the invention. Also speed and power dissipation are considered to select a solution.

It is worth noting here that lookup tables do not show any entry for the null vector Ø since it is not used by the multiplication and it has no rank for multiplication in a GF. In practice, lookup tables are made of binary RAM or ROS memories so the binary address '000', the first address, exists and must contain something. Many alternate solutions are possible. A preferred solution is that address 0 should contain the highest decimal value which is not a GF rank though, i.e., 7 in this example. Thus, when sub-syndromes are null, since addition are performed modulo 7, this does not change the result of the addition while it is still detectable (on the contrary of 0 that would be misinterpreted as $\alpha^0$), if necessary, in a particular application.

Then ranks of vectors i.e., powers of α, are compared (740). If identical, A single burst error (SBE) is detected (760). As mentioned earlier, SBE's affecting ECC bits are decoded differently. This is done by logic (750) which is straightforward to understand. Again, many alternate solutions can be implemented that would achieve the same result differently.

If ranks are not identical an uncorrectable error is detected (745). Obviously, the all-zero syndrome indicative that no error (NE) are found must be decoded too (770). In both cases, (UE and NE) no correction must be attempted on the encoded received word.

Figure 8:
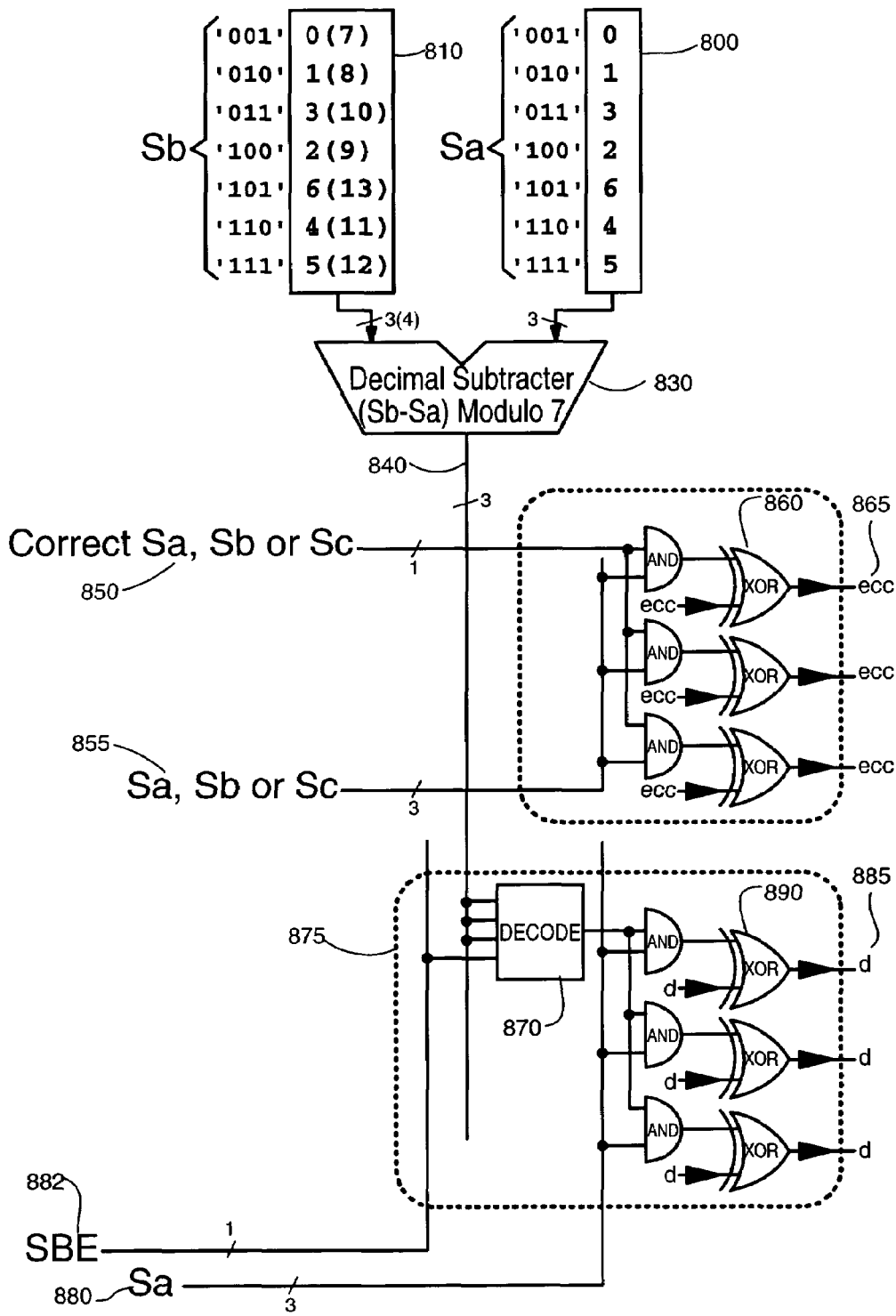
FIG. 8 shows the combinational logic implementing the detection steps of the decoding method according to the preferred embodiment of the invention.

Also logic (750) detects when errors are to be corrected in each group of ECC bits (765) referred to by the corresponding sub-syndrome Sa, Sb and Sc, so as it can be used directly by the correcting logic described in reference to FIG. 8.

FIG. 8 shows the logic necessary to perform a burst correction according to the preferred embodiment. Using the output (760, 765) of the logic circuitry as described in reference to FIG. 7, this component is located in the egress adapter (150) of a communications equipment.

As just mentioned above, ECC bits can be corrected directly from what has been decoded in FIG. 7 (850). The corresponding sub-syndrome (855) must be used to perform correction since, in this particular case, they represent the error pattern that must be applied to the XOR's (860) so as a correction can be performed on ECC bits (865). Obviously, it may not be necessary to perform any correction on the ECC bits if they are not propagated downwards to a next communications equipment.

To correct data bits in a word it is first necessary to locate the group in which errors has occurred. This is achieved by performing a subtraction between the ranks of vectors Sb and Sa (830). Since Sa is always the error pattern multiplied by the identity matrix I (Sa is thus the error pattern to be used for the correction) while Sb is the error pattern multiplied by matrices formed with $\alpha^0$, $\alpha^1$, $\alpha^2$ etc. it is sufficient, to retrieve the errored group, to subtract from the rank of vector Sb (810) the one of vector Sa (800). Obviously, this can be carried out from the same corresponding tables as used in FIG. 7 i.e.: (710) and (700) respectively. Result (840) is placed on a 3-bit bus, value of which is decoded for each group like (875) if SBE is active (862). The group finding a match applies correction from Sa so as corresponding data bits are inverted with the XOR's (890). In the example of the invention there are 7 data groups like (875). And there are always 3 ECC groups with this type of code.

As far as Sb lookup (810) table is concerned one may want to fill it with the rank of the vector plus the length of the GF field i.e., 7 in this example. This alternate preferred embodiment of the invention allows to simplifying the implementation of the subtracter (830) since the result of the subtraction is thus always positive.

Decimal adders and subtracters, modulo the length of the GF, yet necessary to carry out the invention in a preferred embodiment of it, are however not further described. They can be designed and implemented, by those skilled in the art of logic design, from standard known techniques and methods.

Also, even though the invention is described with computation shown to be performed with standard decimal adders and subtracters, on the ranks of vectors obtained from lookup tables (rather than on vectors themselves) the implementation could be carried out as well directly on the binary vectors (without any lookup table) from binary GF multipliers and dividers operating modulo G13 (in lieu, respectively, of adders and subtracter) thus, performing computation directly in the Galois Field. Again, logic designers may want to choose another implementation of the invention while practicing it so as, e.g., to improve performances with a particular technology or for any other reason. Designing and implementing GF multiplier and divider can also be done, by those skilled in the art of logic design, from standard known techniques and methods as well as decimal adder and subtracter modulo the length of the GF field.

Figure 9:
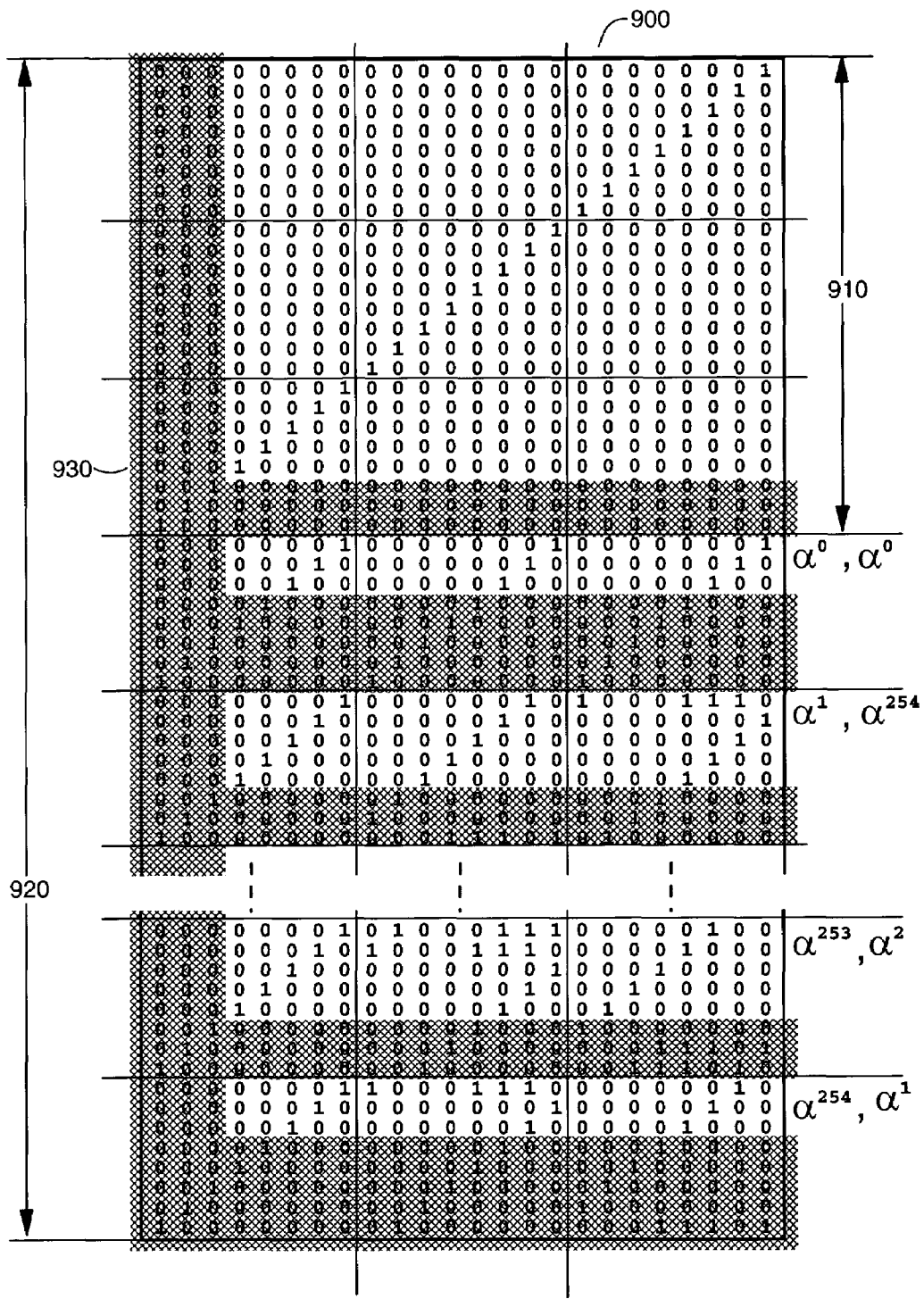
FIG. 9 shows the matrix for a linear systematic (2064, 2040) ECC code according to the preferred embodiment of the invention.

FIG. 9 shows a matrix corresponding to a particular code which is constructed according to what has been previously described. It fits the kind of applications considered by the invention i.e., high-speed switching of short data packets typically, 64-byte packets.

In order to obtain a code long enough to protect a packet as long as 64 bytes, a GF build from a primitive irreducible polynomial of degree 8 is preferably chosen. The first in the list of such polynomials for that degree as published for example in 'Error Correction Codes', Peterson & Weldon, 2nd edition, the MIT Press, 1972, ISBN 0 262 16 039 0, is '435' in octal notation, which corresponds to following generator polynomial:

$G(X)=X^8+X^4+X^3+X^2+1$

Hence, a (2064,2040) code structured according to the invention can be built (900). Only the first five 8-bit groups, including the diagonal matrix (910) and the last two are shown among the (28−1)+3=258 groups of this code. Length (920) is thus 258×8=2064 including 3×8=24 ECC bits (910). To fit the 8B/10B coding of the serial links, made of successive 5-bit and 3-bit sub-blocks after decoding, ECC code of FIG. 9 should be depopulated, as shown, in order to keep it in a systematic form (so as there is a diagonal matrix to allow a straightforward computing of ECC bits). Hence, each 8-bit group is left alternatively with 5 then, 3 bits, starting with the third group (930). After depopulation length of the code is thus comprised of 128 groups of 3 bits plus 127 groups of 5 bits plus 8+8+5=21 ECC bits. A depopulated (1040,1019) code is thus produced covering packets up to 130 bytes (header+payload+ECC bits). Code can correct any sub-block of 3 or 5 bits in error and detects any combination of two sub-blocks in error plus many other uncorrectable errors.

It is worth noting here that a depopulated code, just long enough i.e., longer than 512 bits, using a 127-element GF could be constructed in a similar way from a degree-7 polynomial thus, requiring fewer ECC bits (7+7+5=19) however, this code could not be kept easily as above in a systematic form which would prevent ECC encoding from being simple. Code would be natively a (910,889) code which, after depopulation, could become a (526,509) code. However, ECC bits (7+7+5) then do not fit well into 5-bit and 3-bit sub-blocks.

Obviously, degree-8 code of FIG. 9 need not to be depopulated if application can afford to have 24 ECC bits. In which case, any complete 8-bit block (composed of a 5-bit sub-block and a 3-bit sub-block) is correctable as a whole and any combination of two 8-bit blocks in error is detectable. Also, this could fit another type of 8B/10B coding (this is not the one of the standard though) which is said to be not partitioned and in which single errors can spread on 8 bits after decoding.

The table of FIG. 10 shows the result obtained with the (1040,1019) code built according to the preferred embodiment applied to the example described in reference to FIG. 9. The table of FIG. 10 (1060) should be compared to the one of FIG. 1 (160). Obviously, the number of errors that can be corrected (1070) is less than with a FIRE code since correctable bursts must now be confined to a 5-bit or a 3-bit sub-block (with Fire code of FIG. 1 any 5-bit burst is correctable even though it spans on two bursts an assumption which is not necessary since, with 8B/10B code, an error after decoding is confined to a sub-block).

The number of miscorrections is thus far less important (1080). All such cases are when more than 2 bits in error are spread on more than 2 sub-blocks.

Detection of the uncorrectable errors (1075) is done on the sole basis of the criterion discussed in FIG. 6 and FIG. 7 (745) i.e., when following holds:

$Sa^2=Sa \times Sb$

Hence, overall error correction plus detection reaches 99.5% of all possible errors (1065) that may occur on two bytes (16-bit) of data.

The invention claimed is:

1. A computer-implemented method for encoding a m-bit chain wherein the errors do not spread on more than n bits, n being lesser or equal to m, said method comprising:
choosing an irreducible generator polynomial of degree p, p being greater or equal to n and such that m is lesser or equal to $p(2^p-1)$;
building a matrix using $2^p$ elements of the galois field (GF), generated by the generator polynomial, comprising the $2^p-1$ elements of the multiplicative group $\alpha^0$, $\alpha^1$, $\alpha^2$ ... $\alpha^{p-1}$ and Ø, a null element for the addition and, using p×p blocks wherein the first line is one first element and the other lines are the other elements of the GF multiplicative group obtained by a circular permutation of the first line, in the following way:

defining a first set of p columns comprising a succession of $2^p+2$ blocks wherein the first lines are respectively Ø, Ø and 2p times $\alpha^0$;

defining a second set of p columns comprising a succession of $2^p+2$ blocks wherein the first lines are successively Ø, $\alpha^0$, Ø, $\alpha^0$, $\alpha^1$, $\alpha^2$ ... $\alpha^{p-1}$; and defining a third set of p columns comprising a succession of $2^p+2$ blocks wherein the first lines are successively $\alpha^0$, Ø, Ø, $\alpha^0$, $\alpha^0$, $(\alpha^{p-1})^{-1}$, $(\alpha^{p-2})^{-1}$ ... $(\alpha^1)^{-1}$; and computing a bit chain code for the m-bit chain by performing a matrix multiplication of a bit chain wherein the m MSB bits are the m-bit chain and the remaining LSB bits are all-zero, by the previously built matrix and appending to the m-bit chain the bit chain code as new LSB bits.

2. The method of claim 1 wherein the choosing step comprises choosing the generator polynomial $$G(X)=X^8+X^4+X^3+X^2+1$$

m being assigned to 512, p being assigned to 8.

3. The method of claim 2 wherein the building step further comprises:

suppressing from the just built matrix, the first three columns, the three last rows of the third 8×8 blocks for each column, the five last rows of the fourth 8×8 blocks for each column, the three last rows following 8×8 blocks for each column, and the five last rows of the last block for each column.

4. The method of claim 1 wherein the building step further comprises:

suppressing the third set of p columns; and suppressing the first p rows in the first and second sets of p columns.

5. A computer-implemented method for decoding a received bit chain wherein errors do not spread to more than n bits, said received bit chain comprising an m bit chain formed by the m MSB bits and a code bit chain formed by p remaining LSB bits, p being a degree of an irreducible generator polynomial, p being greater or equal to n such that m is lesser or equal to $p(2^p-1)$, said method comprising:

building a matrix using $2^p$ elements of the galois field (GF), generated by the generator polynomial comprising the $2^p-1$ elements of the multiplicative group, $\alpha^0$, $\alpha^1$, $\alpha^2$ ... $\alpha^{p-1}$ and Ø, a null element for the addition and, using p×p blocks wherein the first line is one first element and other lines are the other elements of the GF multiplicative group obtained by a circular permutation of the first line, in the following way:

defining a first set of p columns comprising a succession of $2^p+2$ blocks wherein the first lines are respectively Ø, Ø and 2p times $\alpha^0$;

defining a second set of p columns comprising a succession of $2^p+2$ blocks wherein the first lines are successively Ø, $\alpha^0$, Ø, $\alpha^0$, $\alpha^1$, $\alpha^2$ ... $\alpha^{p-1}$; and defining a third set of p columns comprising a succession of $2^p+2$ blocks wherein the first lines are successively $\alpha^0$, Ø, Ø, $\alpha^0$, $\alpha^0$, $(\alpha^{p-1})^{-1}$, $(\alpha^{p-2})^{-1}$ ... $(\alpha^1)^{-1}$;

computing a syndrome bit chain for the received bit chain by performing a matrix multiplication of said received bit chain by the previously built matrix; and correcting errors introduced in one of the $2^p-1 \times p$ bit sub chains forming the m MSB bits of the received bit chain by executing the following steps:

performing a division in the GF, the divider being Sa, a p-bit chain formed by p MSB bits of the syndrome bit chain, the dividend being Sb, the following p MSB bits after Sa of the syndrome bit chain and obtaining an exact quotient p bit chain;

using the exact quotient as a range of the p bit sub chain in the m MSB bits of the received bit chain to select a p bit sub chain containing errors; and taking Sa as an error pattern, changing a value of each bit of the selected p bit sub chain at a location identified by the bits in Sa which are set to 1.

6. The method of claim 5 wherein the correcting step further comprise:

correcting a p-bit sub chain of the bit chain code by applying as an error pattern, the p-bit chain formed by a p-bit sub chain in the syndrome bit chain having the same range in the syndrome as the P-bit sub chain in the bit chain code.

7. The method of claim 6 wherein the building step further comprises:

suppressing the third set of p columns; and suppressing the first p rows in the first and second set of p columns.

8. The method of claim 5 further comprising, before the steps for correcting errors, the following steps for detecting the errors in the $2^{p-1} \times p$ bit sub chains forming the m MSB bits of the received bit chain:

if the p bit syndrome is zero, concluding that there is no error and skipping the execution of the steps for correcting errors; and detecting if the errors are correctable by executing the following steps:

computing in the GF two elements of the GF $Sa^2$ and Sb×Sc, Sc being the p LSB bits of the syndrome bit chain;

comparing the two elements $Sa^2$ and Sb×Sc;

if the compared elements are different, concluding that the errors are uncorrectable and skipping the execution of the correcting steps; and if the compared elements are identical and if Sa is not all-zero, concluding that the errors are correctable and executing the steps for correcting errors.

9. The method of claim 8 further comprising for detecting errors in the bit chain code of the receiving bit chain the steps of:

determining if a p-bit sub chain of the bit chain code is not zero and if said p-bit chain is not all-zero, applying the step for correcting errors in the bit chain code to said p-bit sub chain of the bit chain code.

10. The method of claim 9 wherein the step of computing a division in the GF comprises:

creating a lookup table, associating an index from 0 to $2^{p-1}$ to each element of the GF multiplicative group, said index being the rank of the GF element in the GF multiplicative group;

associating an index Ib to Sb and an index Ia to Sa by reading the lookup table;

performing a subtraction modulo $2^{p-1}$ of Ib+$2^{p-1}$ minus Ia; and reading in the lookup table the GF element corresponding to the resulting index of the subtraction the resulting index obtained in the performing a subtraction step, the GF element being a result of the step of computing a division in the GF.

11. The method of claim 9 wherein the step of computing in the GF, the two elements $Sa^2$ and $Sb \times Sc$ comprises:

creating a lookup table, associating an index from 0 to $2^{p-1}$ to each element of the GF multiplicative group, said index being the rank of the GF element in the GF multiplicative group;

associating an index Ib to Sb, an index Ic to Sc and an index Ia to Sa by reading the lookup table;

performing an addition modulo $2^{p-1}$ of Ia and Ia;

performing an addition modulo $2^{p-1}$ of Ib and Ic; and reading in the lookup table the two GF elements corresponding to the two resulting index of the two additions, the two GF elements being the two results of the step of computing in the GF, the two elements $Sa^2$ and $Sb \times Sc$.

12. The method of claim 9 wherein the step of computing in the GF, the two elements $Sa^2$ and $Sb \times Sc$ comprises:

creating a first lookup table having $2^{p-1}$ entries, associating to each element of the GF, its square value computed modulo $2^{p-1}$;

creating a second lookup table having $2^{p-1} \times 2^{p-1}$ entries, each entry being the GF element corresponding to one possible precomputed product of two GF elements; and reading respectively in the lookup tables the two GF elements corresponding to $Sa^2$ and to the product $Sb \times Sc$.

13. The method of claim 12 wherein the choosing step comprises choosing the generator polynomial $G(X) = X^8 + X^4 + X^3 + X^2 + 1$ m being assigned to 512, p being assigned to 8.

14. The method of claim 13 further comprising as the last step for building a matrix, the step of:

suppressing from the just built matrix, first three columns, three last rows of third 8×8 blocks for each column, five last rows of fourth 8×8 blocks for each column, three last rows of following 8×8 blocks for each column and five last rows of a last block for each column.

* * * * *